United States Patent
Watanabe

Patent Number: 6,167,140
Date of Patent: Dec. 26, 2000

[54] AV AMPLIFIER

[75] Inventor: Atsuo Watanabe, Hirakata, Japan

[73] Assignee: Matsushita Electrical Industrial Co., Ltd., Osaka, Japan

[21] Appl. No.: 09/036,689

[22] Filed: Mar. 9, 1998

[30] Foreign Application Priority Data

Mar. 10, 1997 [JP] Japan .................................. 9-054527

[51] Int. Cl.[7] .............................. H02B 1/00; H04R 5/00
[52] U.S. Cl. .............................................. 381/123; 381/22
[58] Field of Search .................................. 381/11, 22, 20, 381/123

[56] References Cited

U.S. PATENT DOCUMENTS

| | | | |
|---|---|---|---|
| 4,115,666 | 9/1978 | Ogura | 369/90 |
| 4,468,806 | 8/1984 | Gaulden et al. | 381/123 |
| 5,399,986 | 3/1995 | Yen | 330/84 |
| 5,757,928 | 5/1998 | Schaar | 381/22 |

Primary Examiner—Forester W. Isen
Assistant Examiner—Brian Tyrone Pendleton
Attorney, Agent, or Firm—Wenderoth, Lind & Ponack, L.L.P.

[57] ABSTRACT

When a first bi-wiring speaker is connected to output terminals 5A and 5B and a second bi-wiring speaker is connected to output terminals 5D and 5E, and further a two-channel stereo reproduction is performed, a signal 3L for a L channel outputted from a decoder 2 is amplified by amplifiers 4A and 4B in parallel to be given to the first bi-wiring speaker in a bi-wiring connecting manner and a signal 3R for a R channel outputted from the decoder 2 is amplified by amplifiers 4C and 4D in parallel and given to the second bi-wiring speaker in a bi-wiring connecting manner. At this time, a gain corrector 7 equalizes a gain which an output signal of the amplifier 4A has with respect to the signal 3L for the L channel with a gain which an output signal of the amplifier 4B has with respect to the signal 3L for the L channel. Similarly, a gain corrector 8 equalizes a gain which an output signal of the amplifier 4C has with respect to the signal 3R for the R channel with a gain which an output signal of the amplifier 4D has with respect to the signal 3R for the R channel.

5 Claims, 14 Drawing Sheets

FIG. 4

| MODE SELECTION | CHANNEL SELECTION | S1 | S2 | S3 | S4 | S5 | S6 | S7 | S8 | S9 | S10 | S11 | S12 |
|---|---|---|---|---|---|---|---|---|---|---|---|---|---|
| OFF | 2ch | OFF | OFF | OFF | OFF | OFF | OFF | OFF | OFF | OFF | OFF | OFF | OFF |
|  | 4ch | OFF | OFF | OFF | OFF | OFF | OFF | OFF | OFF | OFF | OFF | OFF | OFF |
| 1ST | 2ch | OFF | OFF | OFF | OFF | OFF | OFF | OFF | OFF | OFF | OFF | ON | ON |
|  | 4ch | OFF | ON | OFF | ON | OFF | OFF | ON | OFF | ON | OFF | ON | ON |
| 2ND | 2ch | ON | OFF | OFF | OFF | OFF | ON | OFF | OFF | OFF | OFF | OFF | OFF |
|  | 4ch | ON | ON | OFF | ON | OFF | ON | ON | OFF | ON | OFF | OFF | OFF |
| 1ST+2ND | 2ch | ON | OFF | ON | OFF | ON | OFF | OFF | ON | OFF | ON | ON | ON |
|  | 4ch | ON | ON | OFF | ON | OFF | ON | ON | OFF | OFF | OFF | ON | ON |
| Bi-Wire | 2ch | OFF | OFF | OFF | OFF | OFF | OFF | ON | OFF | ON | OFF | ON | ON |
|  | 4ch | ON | ON | OFF | ON | OFF | ON | ON | OFF | ON | OFF | ON | ON | ined
AV AMPLIFIER

BACKGROUND OF THE INVENTION

1. Field of the Invention

The present invention relates to AV amplifiers, and more particularly, to an AV amplifier capable of selectively switching between a multichannel reproducing mode and a two-channel stereo reproducing mode.

2. Description of the Background Art

Recently, the popularity an AV amplifier which performs multichannel reproduction of images and sounds is rapidly increasing due to increasing demand of home theaters. This kind of AV amplifier performs the multichannel reproduction by decoding audio information (which is multichannel audio information encoded as two-channel audio information) obtained from various sources (such as a DVD, digital broadcast and so forth). On the other hand, demands for stereo reproduction with a single high-class speaker compatible with bi-amp and bi-wiring (hereinafter referred to as a bi-wiring speaker), in which sound quality is valued, are still great. It is a great burden in terms of price and space to buy and set an amplifier for a home theater and an amplifier for stereo reproduction separately. Therefore, the use of one AV amplifier to perform multichannel reproduction and also drive bi-wiring speakers in stereo has been implemented.

A method of driving a bi-wiring speaker by using a conventional multichannel AV amplifier will be described below, referring to a drawing. FIG. 14 is a block diagram showing a state in which the bi-wiring speakers are connected to the conventional AV amplifier. In FIG. 14, two-channel signals (in which multichannel (here, four-channel) information is encoded) obtained from a source which is not shown in the figure (such as a DVD, digital broadcast and so forth) are inputted from input terminals 1L and 1R and decoded as original four-channel signals by a decoder 2. A signal 3L for a L channel outputted from the decoder 2 is amplified by an amplifier 4A for the L channel and then inputted to a terminal HF for high-frequency and a terminal LF for low-frequency of a bi-wiring speaker 6L for the L channel in parallel. Similarly, a signal 3R for a R channel outputted from the decoder 2 is amplified by an amplifier 4C for the R channel and then inputted to a terminal HF for high-frequency and a terminal LF for low-frequency of a bi-wiring speaker 6R for the R channel in parallel. A signal 3C for a C channel (a center channel) outputted from the decoder 2 is amplified by an amplifier 4B for the C channel and then inputted to a center speaker 11. Also, a signal 3S for a S channel (a surround channel) outputted from the decoder 2 is amplified by an amplifier 4D for the S channel and then inputted to a surround speaker 12.

The conventional AV amplifier has a problem such that in the case where the bi-wiring speakers 6L and 6R are driven in a two-channel stereo reproducing mode by using the conventional AV amplifier as described in the above, only two amplifiers which are the amplifier 4A for the L channel and the amplifier 4C for the R channel are used as an amplifying circuit, therefore the bi-wiring speaker is substantially used in a normal mode in which the terminals HF for high-frequency and the terminals LF for low-frequency are short circuited as shown in FIG. 14, thereby high-quality sound reproduction with the bi-wiring connection can not be realized.

SUMMARY OF THE INVENTION

Therefore, an object of the present invention is to provide an AV amplifier capable of performing multichannel reproduction and driving a bi-wiring speaker with high-quality sound using bi-wiring connection at a two-channel stereo reproducing time as well.

The present invention has such features as shown below to achieve the above-mentioned object.

A first aspect of the present invention is an AV amplifier capable of selectively switching between a multichannel reproducing mode and a two-channel stereo reproducing mode, comprising:

a decoder decoding input signals in which multichannel signals are encoded to output multichannel signals in the multichannel reproducing mode, and outputting inputted two-channel stereo signals as they are in the two-channel stereo reproducing mode;

a plurality of amplifiers for amplifying output signals of the decoder;

a plurality of output terminals to each of which speakers are connected, and which transfer output signals of the amplifiers to the connected speakers;

a mode selector for selecting either the multichannel reproducing mode or the two-channel stereo reproducing mode; and a switching circuit for switching connected relation among the decoder, the plurality of amplifiers and the plurality of output terminals in accordance with mode selection by the mode selector, wherein when a plurality of speakers for multichannel reproduction are connected to the output terminals and the multichannel reproducing mode is selected, the switching circuit switches the connected relation so that the multichannel signals outputted from the decoder are amplified by the plurality of amplifiers for each channel and the signal outputted from each of the amplifiers is given to the speaker of a corresponding channel; and when a pair of speakers compatible with bi-wiring are connected to the output terminals and the two-channel stereo reproducing mode is selected, the switching circuit switches the connected relation so that among the two-channel stereo signals outputted form the decoder, signals for a L channel are amplified in parallel by first and second amplifiers in the plurality of amplifiers and signals for a R channel are amplified in parallel by a third and fourth amplifiers in the plurality of amplifiers, and further output signals of the first and second amplifiers are given to one of the pair of speakers in a bi-wiring connection manner and output signals of the third and fourth amplifiers are given to the other one of the pair of speakers in the bi-wiring connection manner.

As described in the above, according to the first aspect, the bi-wiring speakers can be driven in high-quality sounds with the bi-wiring connection by the multi-amplifiers at the two-channel stereo reproducing time without changing the connection of the speakers. Accordingly, a user does not have to buy and set a new amplifier for bi-wiring speakers, thereby a multi-function amplifier which is space-saving can be realized at a low cost.

A second aspect of the present invention is characterized in that, in the first aspect, the AV amplifier further comprising:

a first gain corrector for correcting a difference between gains of the first and second amplifiers; and a second gain corrector for correcting a difference between gains of the third and fourth amplifiers, wherein the switching circuit switches the connected relation so that the first and second gain correctors are activated when the pair of speakers compatible with bi-wiring are connected to the output terminals and the two-channel stereo reproducing mode is selected.

As the first and second amplifiers are compatible with driving speakers for different channels primarily, the gains of the amplifiers are different in many cases. This is the same as for the third and fourth amplifiers. On the other hand, it is a principle that the bi-wiring speaker is driven by the multi-amplifier which has the equal gain. Then, in the second aspect, the difference between the gains of the first and second amplifiers is corrected with the first gain corrector and the difference between the gains of the third and fourth amplifiers is corrected with the second gain corrector, thereby the amplifiers which are prepared for multichannel can be used in a manner suitable for driving the bi-wiring speakers.

A third aspect of the present invention is characterized in that in the second aspect:

the first gain corrector corrects gains so that a gain which an output signal of the first amplifier has with respect to the signal for the L channel is nearly equal to a gain which an output signal of the second amplifier has with respect to the signal for the L channel, and the second gain correctors corrects gains so that a gain which an output signal of the third amplifier has with respect to the signal for the R channel is nearly equal to a gain which an output signal of the fourth amplifier has with respect to the signal for the R channel.

As stated in the above, according to the third aspect, when the bi-wiring speakers are driven in the two-channel stereo reproducing mode, the gains are corrected so that the difference between the gains of the first and second amplifiers becomes nearly 0 and the difference between the gains of the third and fourth amplifiers becomes nearly 0, which realizes ideal bi-wiring reproduction.

A fourth aspect of the present invention is characterized in that in the third aspect, the first and second gain correctors include fine adjusting means for fine adjusting gain correcting amounts.

As described in the above, according to the fourth aspect, it is possible to fine adjust the first and second gain correctors, thereby deterioration of frequency characteristics caused by dispersion in constants between the first and second gain correctors, difference of speaker models to be used and difference of sound characteristics of listening rooms can be corrected as well.

A fifth aspect of the present invention is characterized in that, in the first aspect, the switching circuit comprises:

a plurality of switches placed among the decoder, the plurality of amplifiers and the plurality of output terminals as necessary; and a computer unit controlling on/off state of each of the switches in accordance with the mode selection by the mode selector.

As mentioned in the above, according to the fifth aspect, since the on/off state of the switches are controlled by the computer unit, it is readily possible to deal with changes of connected speakers due to an upgrade of an AV system and so on.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a drawing showing combinations of an ON/OFF state of each switch controlled by a CPU in the first embodiment of the present invention.

DESCRIPTION OF THE PREFERRED EMBODIMENTS

Figure 1:
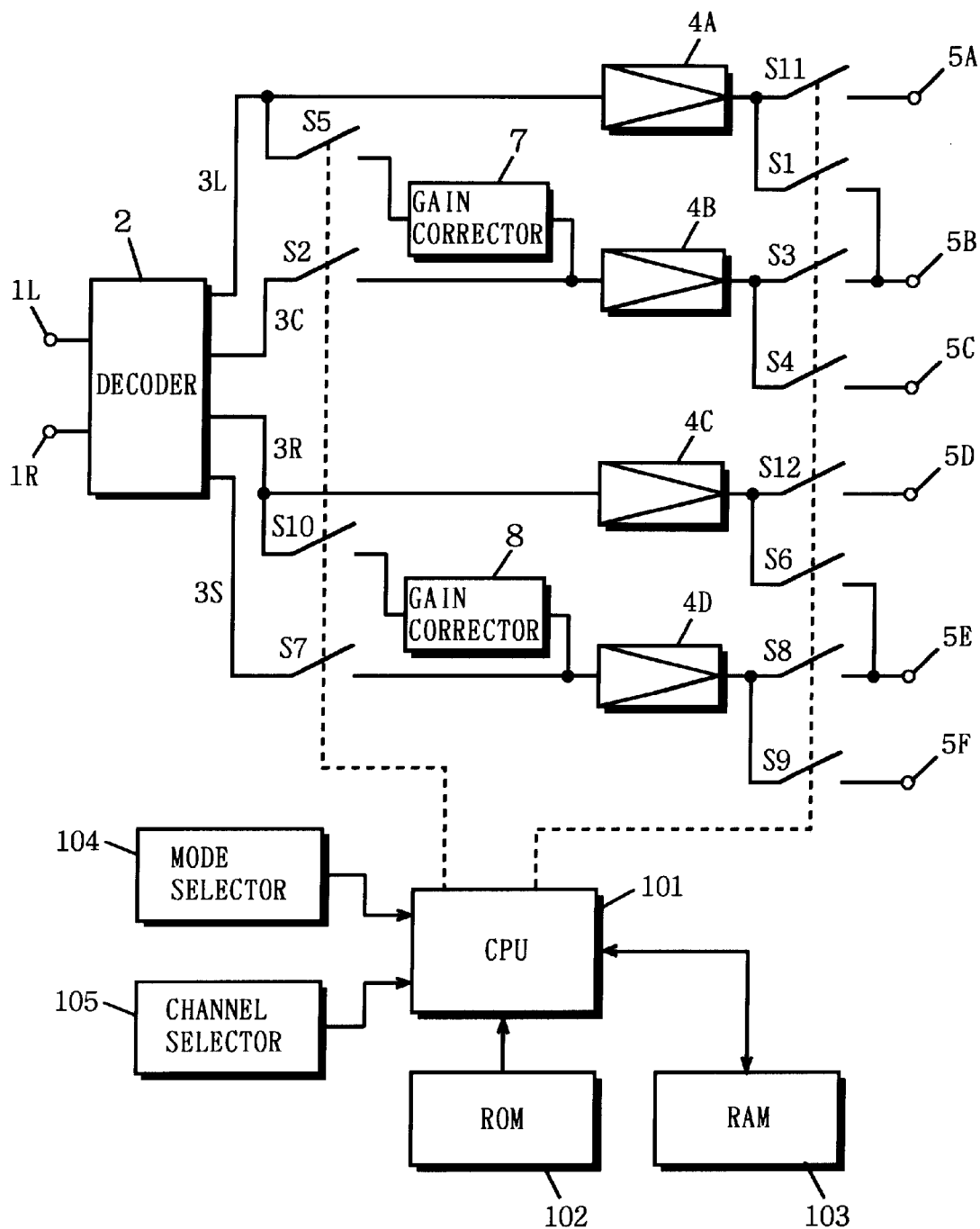
FIG. 1 is a block diagram showing a structure of an AV amplifier according to a first embodiment of the present invention.

FIG. 1 is a block diagram showing a structure of an AV amplifier according to a first embodiment of the present invention. In FIG. 1, two-channel signals (in which multi-channel (here, four-channel) information is encoded) obtained from a source which is not shown in the figure (a DVD, digital broadcast and so forth) are inputted from input terminals 1L and 1R and decoded as original four-channel signals by a decoder 2. A signal 3L for a L channel outputted from the decoder 2 is amplified by an amplifier 4A for the L channel to be given to an output terminal 5A through a switch S11 and given to an output terminal 5B through a switch S1 as well. Also, a signal 3C for a C channel (a center channel) outputted from the decoder 2 is amplified by an amplifier 4B for the C channel through a switch S2 to be given to the output terminal 5B through a switch S3 and given to an output terminal 5C through a switch S4 as well. Further, a signal 3R for a R channel outputted from the decoder 2 is amplified by an amplifier 4C for the R channel to be given to an output terminal 5D through a switch S12 and given to an output terminal 5E through a switch S6 as well. Also, a signal 3S for a S channel (a surround channel) outputted from the decoder 2 is amplified by an amplifier 4D for the S channel through a switch S7 to be given to the output terminal 5E through a switch S8 and given to an output terminal 5F through a switch S9 as well. Moreover, the signal 3L for the L channel outputted from the decoder 2 is also given to the amplifier 4B for the C channel through a switch S5 and a gain corrector 7. Similarly, the signal 3R for the R channel outputted from the decoder 2 is also given to the amplifier 4D for the S channel through a switch S10 and a gain corrector 8.

A CPU 101 controls on/off of the switches S1–S12 in accordance with selection information given by a mode selector 104 and a channel selector 105. The mode selector 104 and the channel selector 105 are provided on a control panel of the AV amplifier and controlled by an user. The mode selector 104 selects a speaker to be used. The channel selector 105 selects either a two-channel stereo reproducing mode or a four-channel reproducing mode. A ROM 102 stores an operation program for the CPU 101. The CPU 101 operates according to the operation program. A RAM 103 functions as a working memory for storing various work data generating when the CPU 101 operates in accordance with the program.

Figure 2:
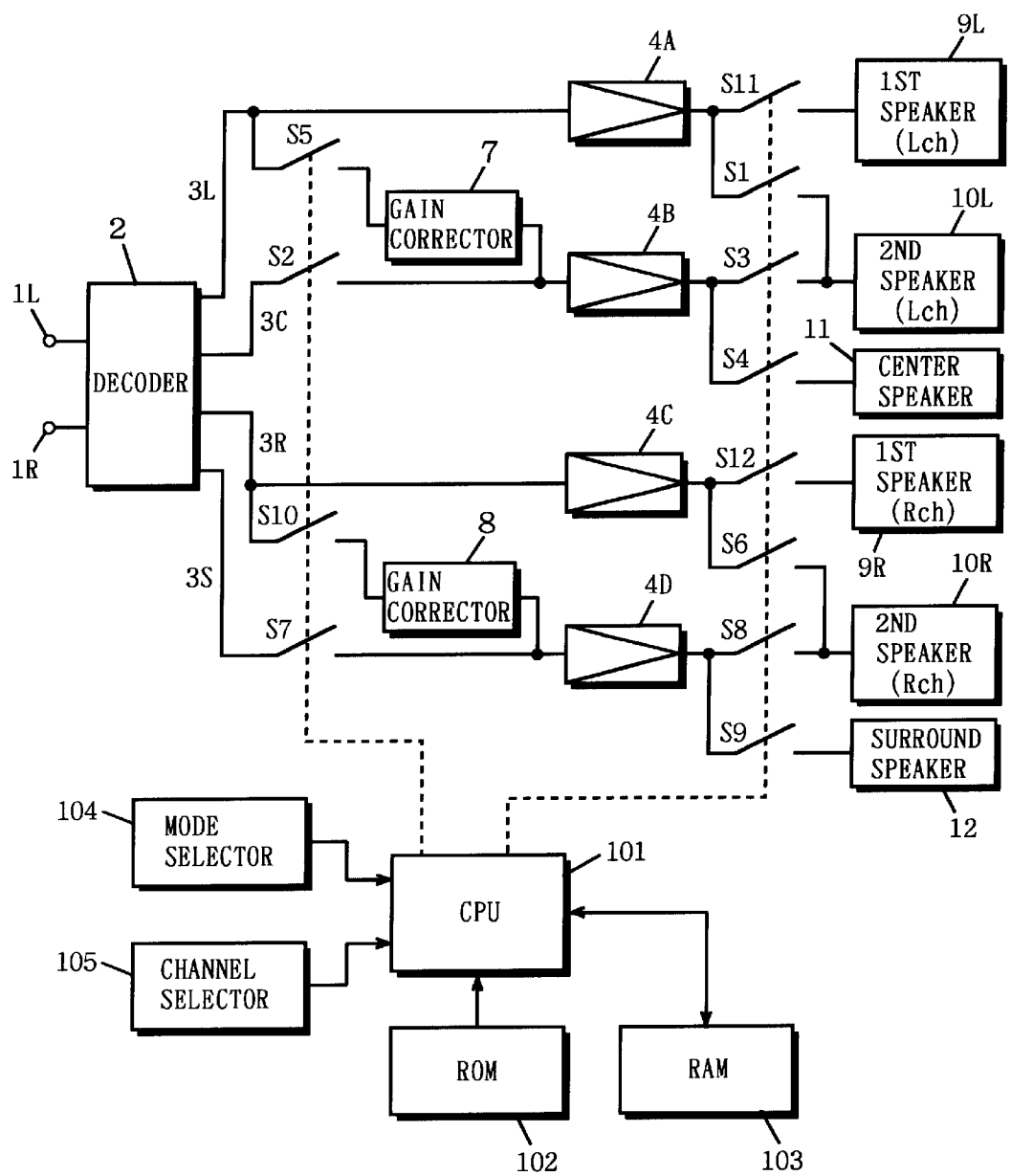
FIG. 2 is a block diagram showing a first example of connection of a speaker unit with respect to the AV amplifier in FIG. 1.

FIG. 2 is a block diagram showing a first example of connection of a speaker unit with respect to the AV amplifier in FIG. 1. In FIG. 2, a first speaker 9L for the L channel is connected to the output terminal 5A, a second speaker 10L for the L channel is connected to the output terminal 5B, a center speaker 11 is connected to the output terminal 5C, a first speaker 9R for the R channel is connected to the output terminal 5D, a second speaker 10R for the R channel is connected to the output terminal 5E and a surround speaker 12 is connected to the output terminal 5F. The first speaker set of 9L and 9R and the second speaker set of 10L and 10R can be simultaneously driven or only either of the two speaker sets can be driven. When the first speaker set of 9L and 9R and the second speaker set of 10L and 10R are placed in a same room, the both speaker sets are simultaneously driven in many cases. On the other hand, when the first speaker set of 9L and 9R and the second speaker set of 10L and 10R are placed in separate rooms, each of the speaker sets is driven individually in many cases. As an example of placing the speaker sets in the separate rooms, a situation where one of the speaker sets is placed in a living room with the center speaker 11 and the surround speaker 12 and the other speaker set is placed in a bedroom is assumed.

Figure 3:
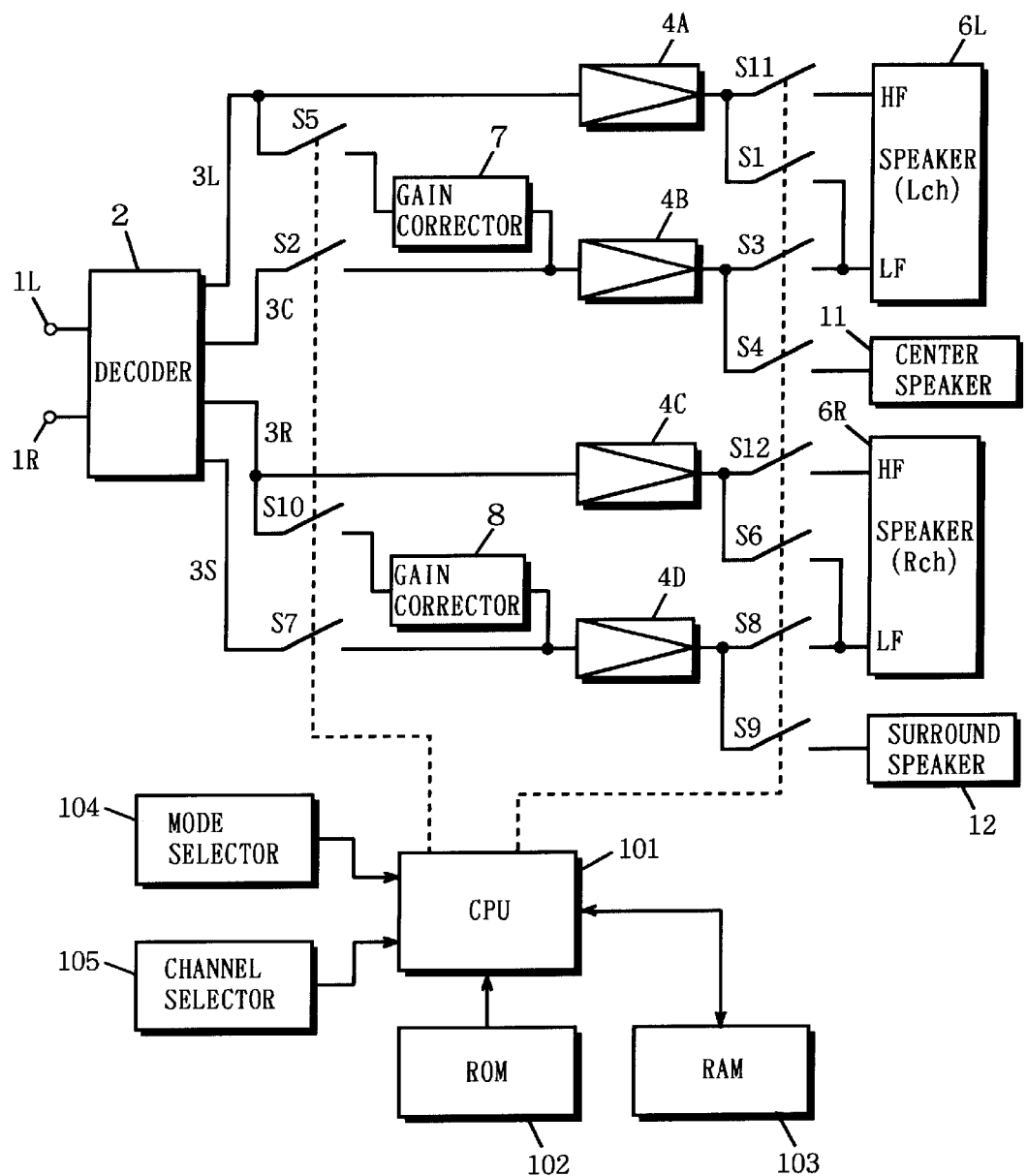
FIG. 3 is a block diagram showing a second example of connection of the speaker unit with respect to the AV amplifier in FIG. 1

FIG. 3 is a block diagram showing a second example of connection of the speaker unit with respect to the AV amplifier in FIG. 1. In FIG. 3, a terminal HF for high-frequency of a bi-wiring speaker 6L for the L channel is connected to the output terminal 5A, a terminal LF for low-frequency of the bi-wiring speaker 6L for the L channel is connected to the output terminal 5B, the center speaker 11 is connected to the output terminal 5C, a terminal HF for high-frequency of a bi-wiring speaker 6R for the R channel is connected to the output terminal 5D, a terminal LF for low-frequency of the bi-wiring speaker 6R for the R channel is connected to the output terminal 5E and the surround speaker 12 is connected to the output terminal 5F. In the present embodiment, the bi-wiring speaker set of 6L and 6R can be driven for the two-channel stereo reproduction which is an original usage manner and can also be driven for the four-channel reproduction which is mainly a mode for reproducing sounds accompanying images.

FIG. 4 is a diagram showing combinations of an on/off state of each of the switches S1–12 controlled by the CPU 101 in FIG. 1. FIG. 5–FIG. 12 are diagrams showing operating states of the AV amplifier in FIG. 1 corresponding to each of the on/off states shown in FIG. 4. Operation of the first embodiment will be described below with referring to FIG. 4–FIG. 12.

First, operation of the decoder 2 will be explained. At the four-channel reproducing time, signals in which multichannel signals are encoded such as a film are inputted from the input terminals 1L and 1R. In this case, the decoder 2 separates the inputted signals into four signals and outputs the four signals as the signal 3L for the L channel, the signal 3C for the C channel, the signal 3R for the R channel and the signal 3S for the S channel. While, at the two-channel stereo reproducing time, two-channel signals in which multichannel signals are not encoded are inputted from the input terminal 1L and 1R. In this case, the decoder 2 outputs only the signal 3L for the L channel and the signal 3R for the R channel.

Next, operation in the case where mode selection by the mode selector 104 is in an off state will be explained. The above-mentioned state is set up, for example, when the sound is listened with a headphones, not with speakers. In this case, as shown in FIG. 4, the CPU 101 sets all of the switches S1–S12 in off states (open states). Accordingly, at this time, the signals outputted from the decoder 2 are not given to any of the speakers but to the headphones which are not shown.

Figure 5:
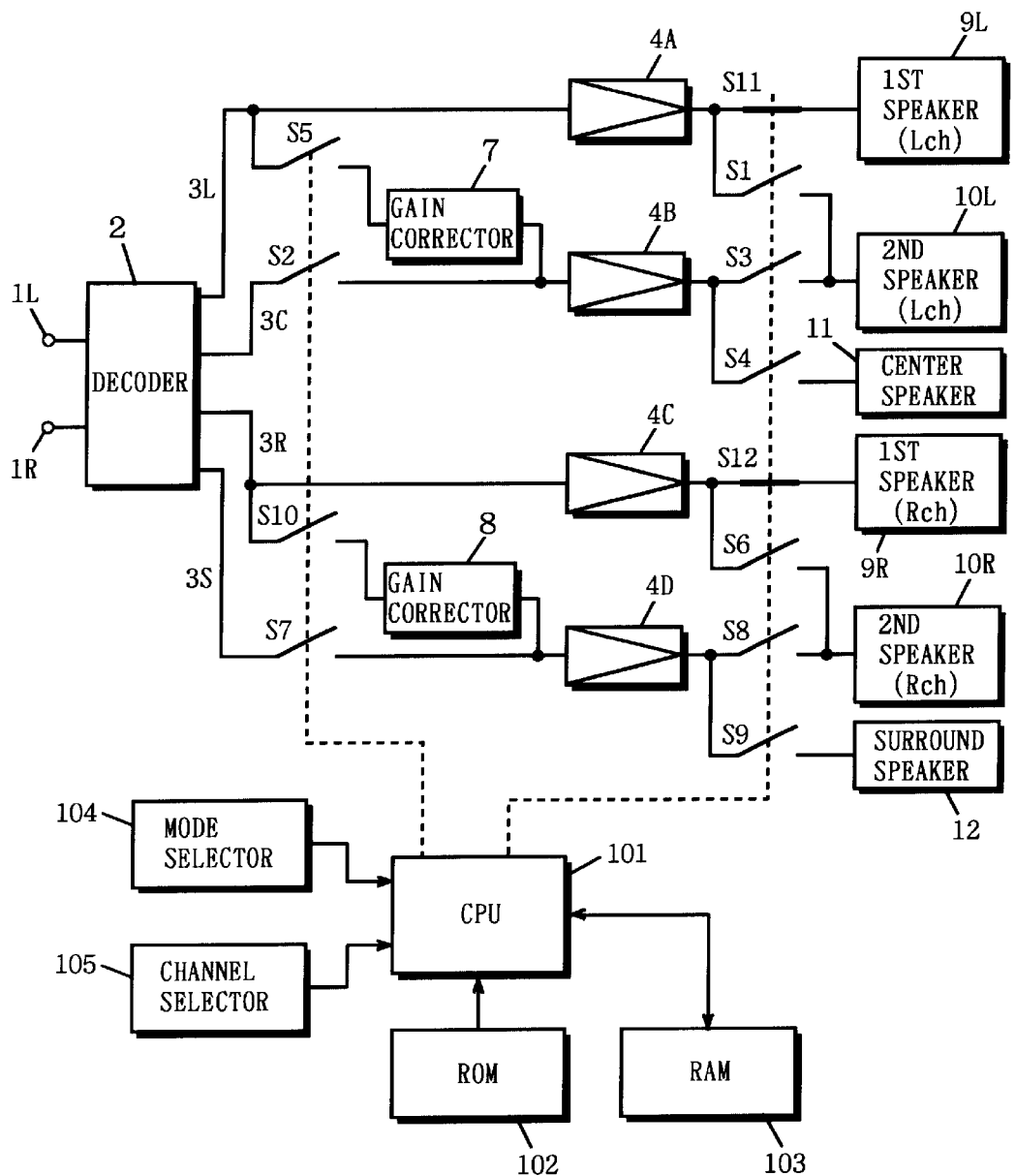
FIG. 5 is a drawing showing a first example of the ON/OFF state of each of the switches in the first embodiment of the present invention.
Figure 6:
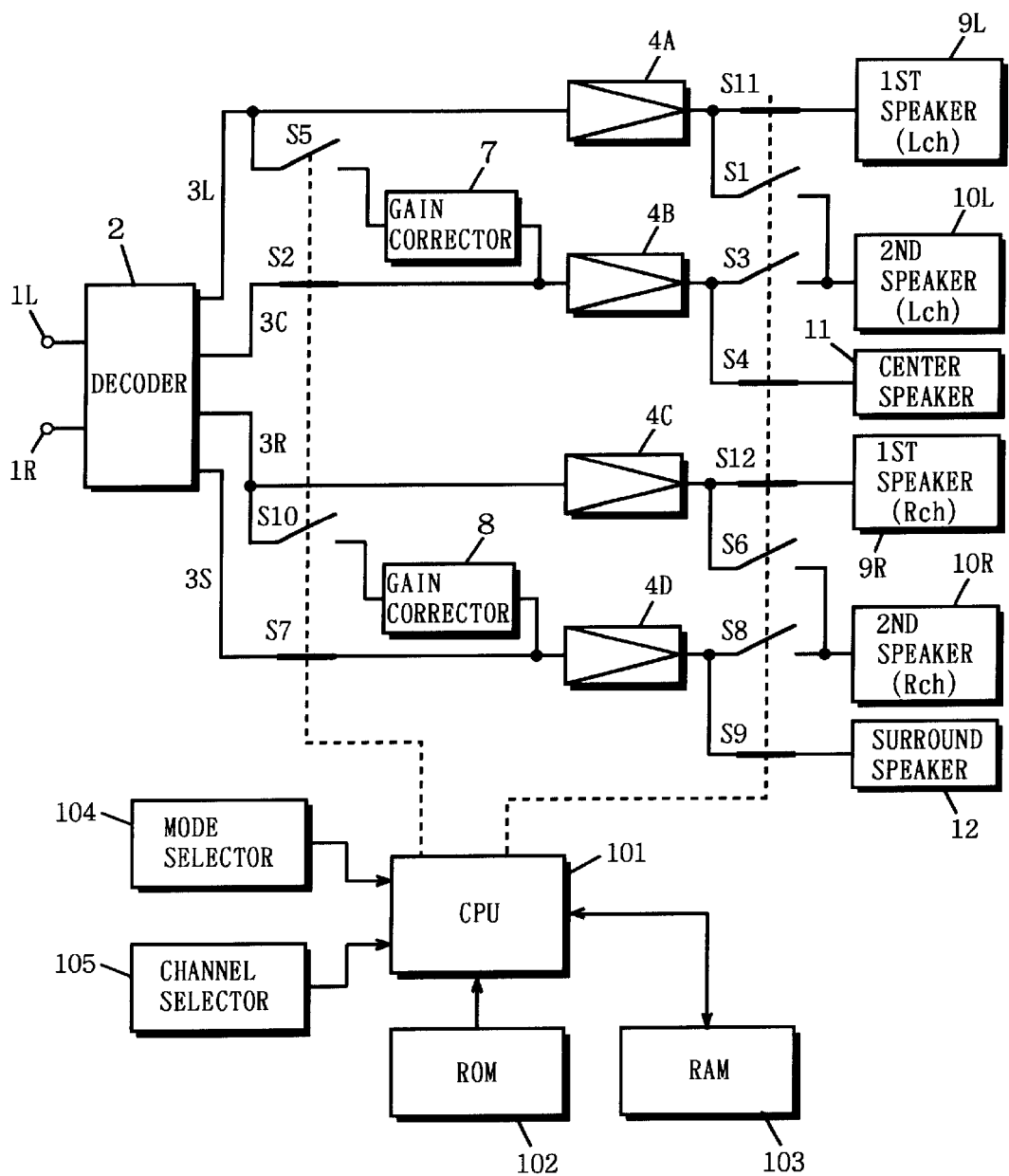
FIG. 6 is a drawing showing a second example of the ON/OFF state of each of the switches in the first embodiment of the present invention.

Next, operation in the case where the mode selector 104 selects a mode for driving the first speaker set of 9L and 9R will be explained. First, when the channel selector 105 selects the two-channel stereo reproduction, as shown in FIG. 4, the CPU 101 sets only the switches S11 and S12 in on states (close states) and sets the other switches in off states. In this case, as shown in FIG. 5, the signal 3L for the L channel outputted from the decoder 2 is amplified by the amplifier 4A for the L channel to be given to the first speaker 9L for the L channel. Also, the signal 3R for the R channel outputted from the decoder 2 is amplified by the amplifier 4C for the R channel to be given to the first speaker 9R for the R channel. Therefore, at this time, the stereo reproduction is performed with the first speaker set of 9L and 9R. On the other hand, when the channel selector 105 selects the four-channel reproduction, as shown in FIG. 4, the CPU 101 sets the switches S2, S4, S7, S9, S11 and S12 in on states and sets the other switches in off states. In this case, as shown in FIG. 6, the signal 3L for the L channel outputted from the decoder 2 is amplified by the amplifier 4A for the L channel to be given to the first speaker 9L for the L channel. Also, the signal 3C for the C channel outputted from the decoder 2 is amplified by the amplifier 4B for the C channel to be given to the center speaker 11. Further, the signal 3R for the R channel outputted form the decoder 2 is amplified by the amplifier 4C for the R channel to be given to the first speaker 9R for the R channel. Also, the signal 3S for the S channel outputted from the decoder 2 is amplified by the amplifier 4D for the S channel to be given to the surround speaker 12. Therefore, at this time, the four-channel reproduction is performed with the first speaker set of 9L and 9R, the center speaker 11 and the surround speaker 12.

Figure 7:
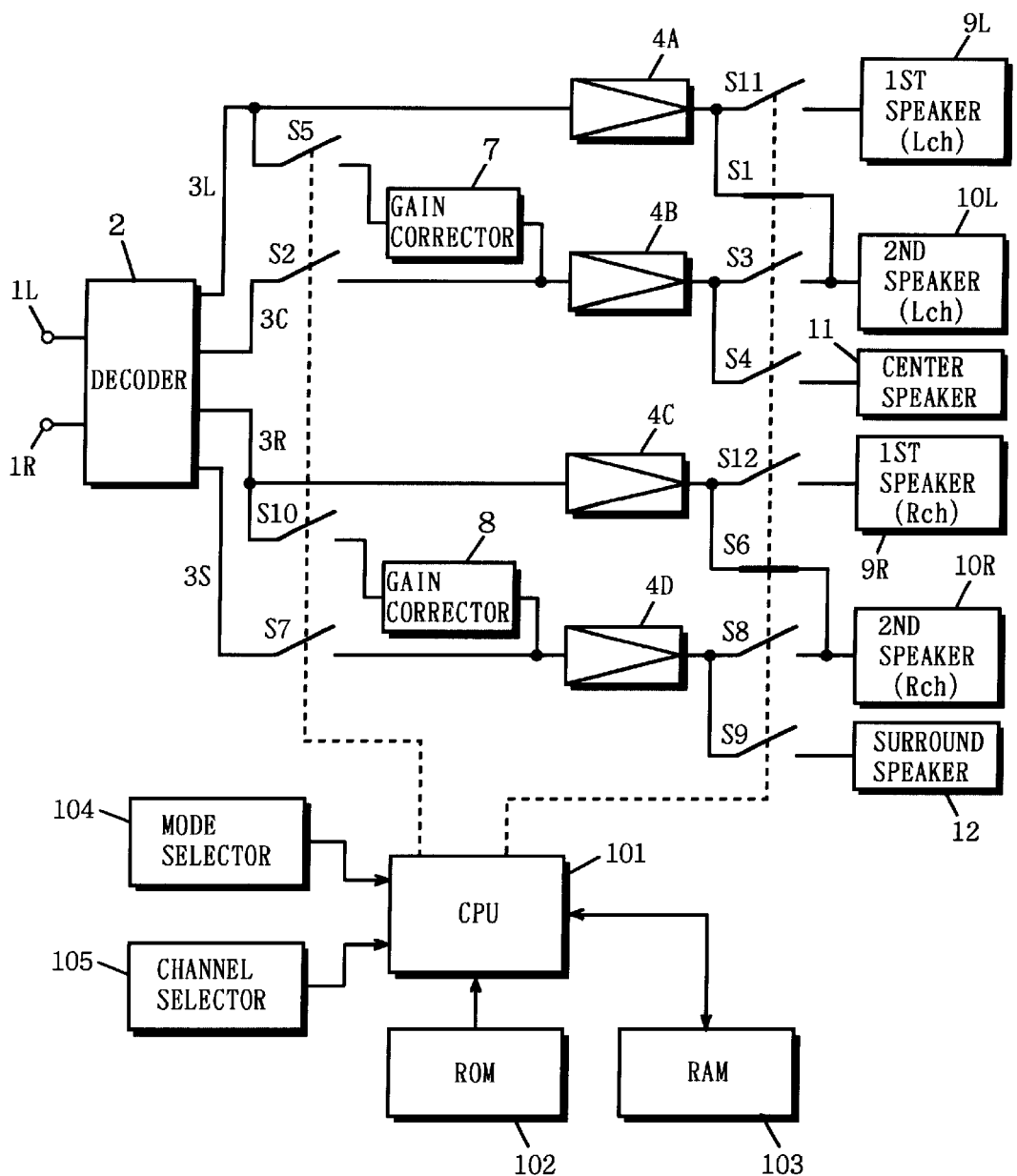
FIG. 7 is a drawing showing a third example of the ON/OFF state of each of the switches in the first embodiment of the present invention.
Figure 8:
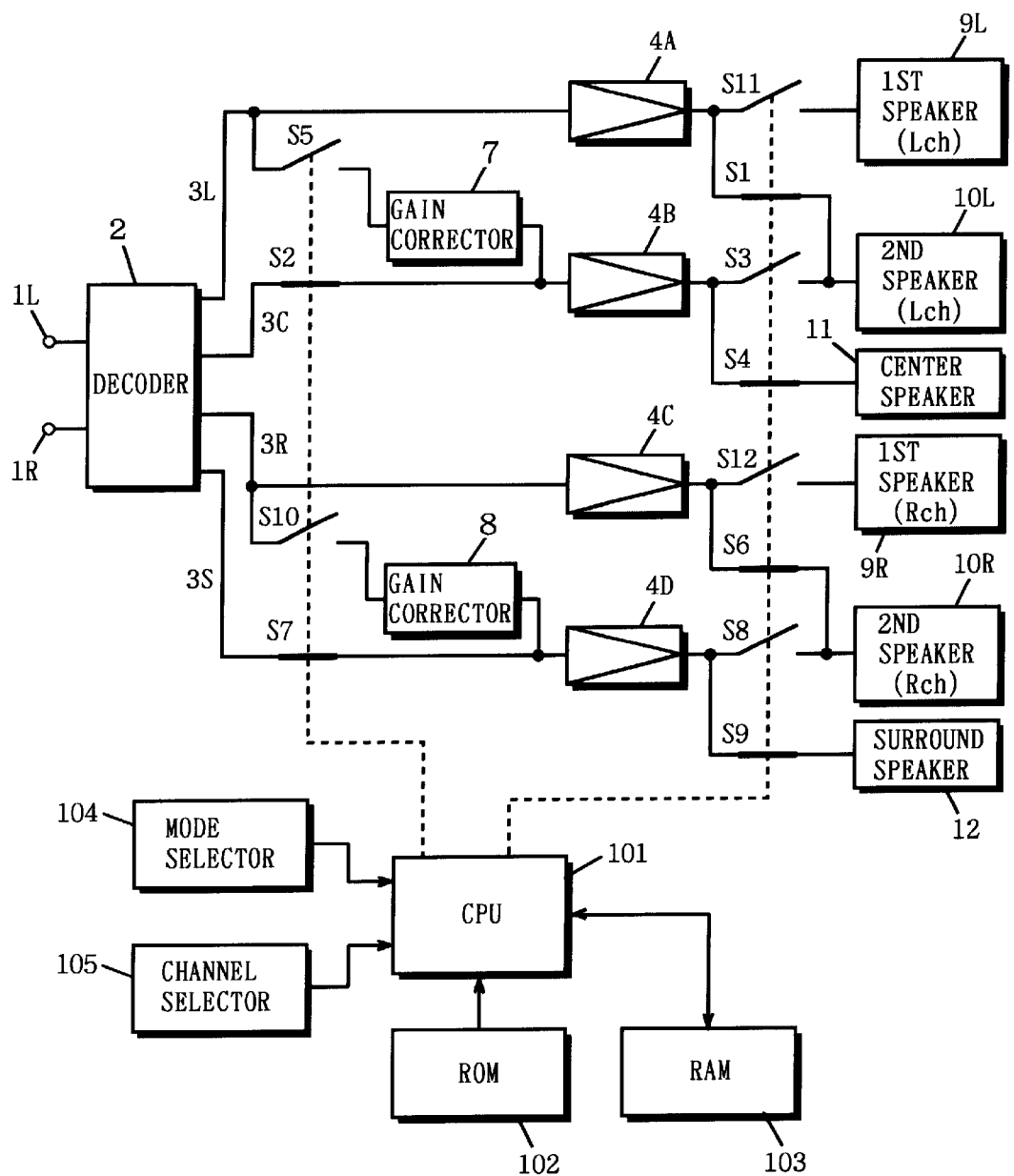
FIG. 8 is a drawing showing a fourth example of the ON/OFF state of each of the switches in the first embodiment of the present invention.

Next, operation in the case where the mode selector 104 selects a mode for driving the second speaker set of 10L and 10R will be explained. First, when the channel selector 105 selects the two-channel stereo reproduction, as shown in FIG. 4, the CPU 101 sets only the switches S1 and S6 in on states and sets the other switches in off states. In this case, as shown in FIG. 7, the signal 3L for the L channel outputted form the decoder 2 is amplified by the amplifier 4A for the L channel to be given to the second speaker 10L for the L channel. Also, the signal 3R for the R channel outputted form the decoder 2 is amplified by the amplifier 4C for the R channel to be given to the second speaker 10R for the R channel. Accordingly, at this time, the stereo reproduction is performed by using the second speaker set of 10L and 10R. On the other hand, when the channel selector 105 selects the four-channel reproduction, as shown in FIG. 4, the CPU 101 sets the switches S1, S2, S4, S6, S7 and S9 in on states and sets the other switches in off states. In this case, as shown in FIG. 8, the signal 3L for the L channel outputted from the decoder 2 is amplified by the amplifier 4A for the L channel to be given to the second speaker 10L for the L channel. Also, the signal 3C for the C channel outputted from the decoder 2 is amplified by the amplifier 4B for the C channel to be given to the center speaker 11. Further, the signal 3R for the R channel outputted from the decoder 2 is amplified by the amplifier 4C for the R channel to be given to the second speaker 10R for the R channel. Also, the signal 3S for the S channel outputted from the decoder 2 is amplified by the amplifier 4D for the S channel to be given to the surround speaker 12. Accordingly, at this time, the four-channel reproduction is performed by using the second speaker set of 10L and 10R, the center speaker 11 and the surround speaker 12.

Figure 9:
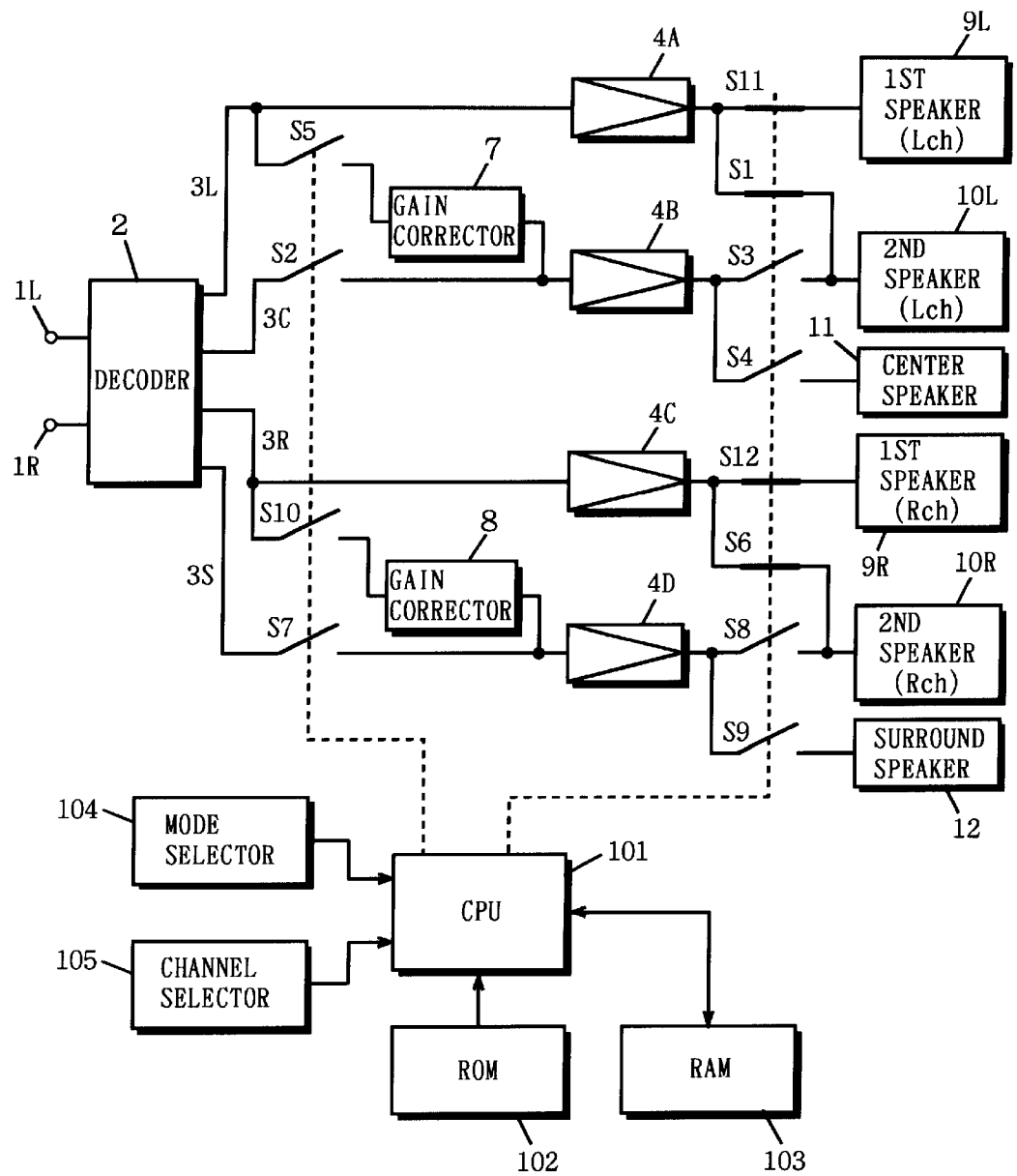
FIG. 9 is a drawing showing a fifth example of the ON/OFF state of each of the switches in the first embodiment of the present invention.
Figure 10:
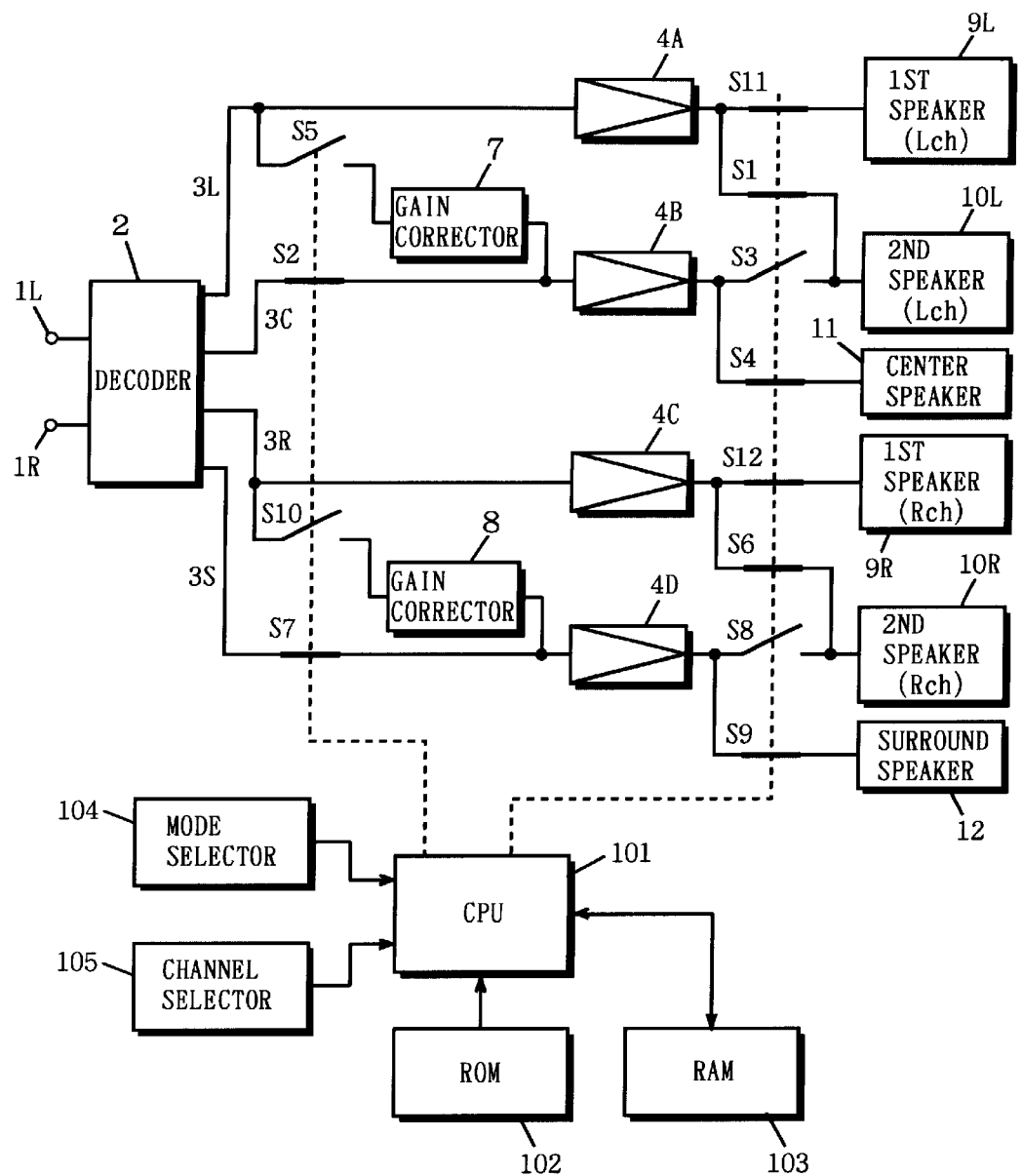
FIG. 10 is a drawing showing a sixth example of the ON/OFF state of each of the switches in the first embodiment of the present invention.

Next, operation in the case where the mode selector 104 selects a mode for driving both of the first speaker set of 9L and 9R and the second speaker set of 10L and 10R will be described. First, when the channel selector 105 selects the two-channel stereo reproduction, as shown in FIG. 4, the CPU 101 sets the switches S1, S6, S11 and S12 in on states and sets the other switches in off states. In this case, as shown in FIG. 9, the signal 3L for the L channel outputted from the decoder 2 is amplified by the amplifier 4A for the L channel to be given to the first and second speakers 9L and 10L for the L channel in parallel. Also, the signal 3R for the R channel outputted from the decoder 2 is amplified by the amplifier 4C for the R channel to be given to the first and second speakers 9R and 10R for the R channel in parallel. Therefore, at this time, the stereo reproduction is performed by using both of the first and second speaker sets of 9L and 9R and 10L and 10R. On the other hand, when the channel selector 105 selects the four-channel reproduction, as shown in FIG. 4, the CPU 101 sets the switches S1, S2, S4, S6, S7, S9, S11 and S12 in on states and sets the other switches in off states. In this case, as shown in FIG. 10, the signal 3L for the L channel outputted from the decoder 2 is amplified by the amplifier 4A for the L channel to be given to the first and second speakers 9L and 10L for the L channel. Further, the signal 3C for the C channel outputted form the decoder 2 is amplified by the amplifier 4B for the C channel to be given to the center speaker 11. Also, the signal 3R for the R channel outputted from the decoder 2 is amplified by the amplifier 4C for the R channel to be given to the first and second speakers 9R and 10R for the R channel. Further, the signal 3S for the S channel outputted from the decoder 2 is amplified by the amplifier 4D for the S channel to be given to the surround speaker 12. Accordingly, at this time, the four-channel reproduction is performed by using the first and second speaker sets of 9L and 9R and 10L and 10R, the center speaker 11 and the surround speaker 12.

Next, operation in the case where the mode selector 104 selects a mode for driving the bi-wiring speaker set of 6L and 6R will be described. A connection condition of the speakers in this case is shown in FIG. 3.

Figure 11:
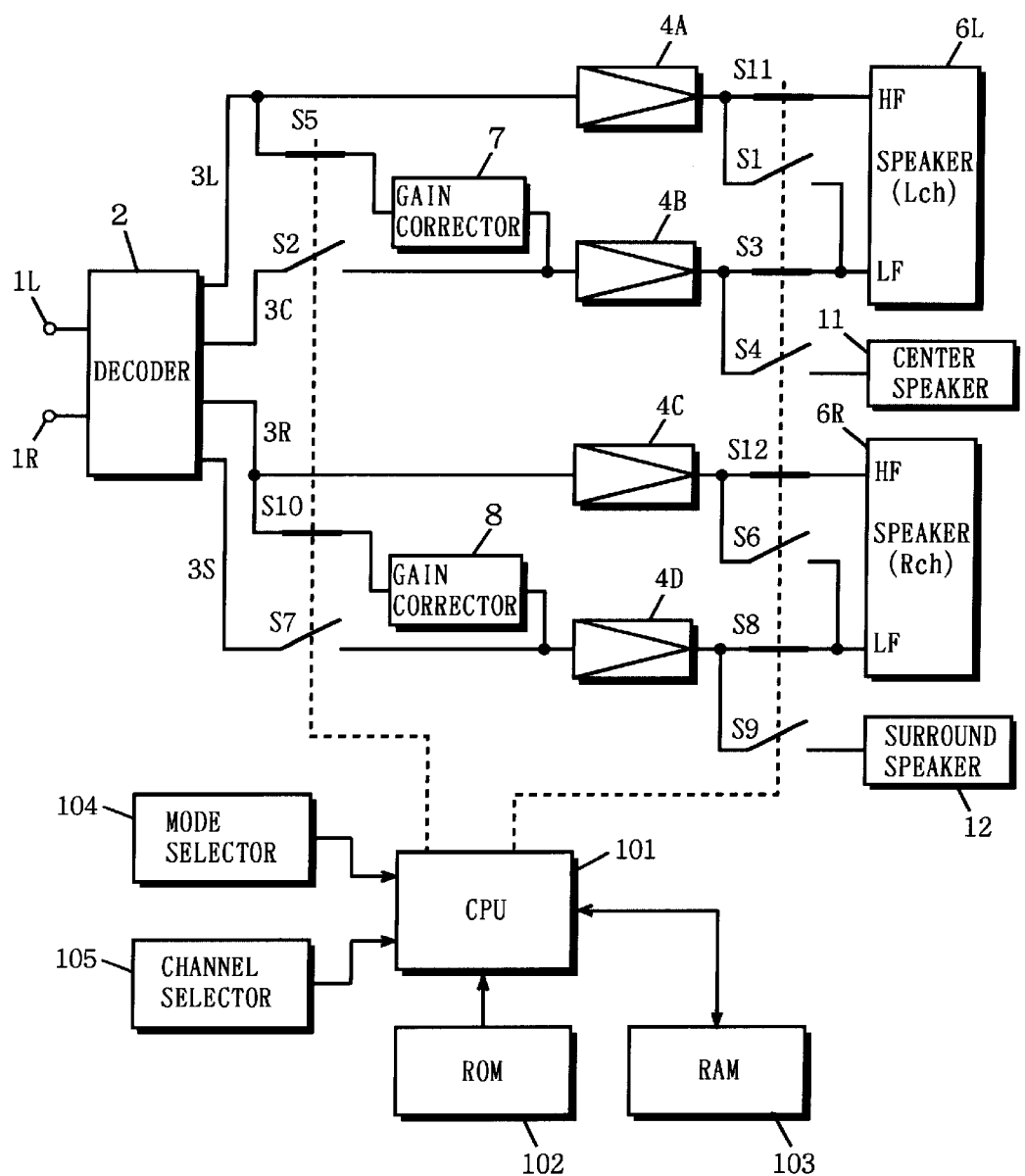
FIG. 11 is a drawing showing a seventh example of the ON/OFF state of each of the switches in the first embodiment of the present invention.

First, when the channel selector 105 selects the two-channel stereo reproduction, as shown in FIG. 4, the CPU 101 sets the switches S3, S5, S8, S10, S11 and S12 in on states and sets the other switches in off states. In this case, as shown in FIG. 11, the signal 3L for the L channel outputted from the decoder 2 is amplified by the amplifier 4A for the L channel to be given to the terminal HF for high-frequency of the bi-wiring speaker 6L for the L channel. Also, the signal 3L for the L channel outputted from the decoder 2 is adjusted in level by the gain corrector 7 and amplified by the amplifier 4B for the C channel to be given to the terminal LF for low-frequency of the bi-wiring speaker 6L for the L channel. Further, the signal 3R for the R channel outputted from the decoder 2 is amplified by the amplifier 4C for the R channel to be given to the terminal HF for high-frequency of the bi-wiring speaker 6R for the R channel. Also, the signal 3R for the R channel outputted from the decoder 2 is adjusted in level by the gain corrector 8 and amplified by the amplifier 4D for the S channel to be given to the terminal LF for low-frequency of the bi-wiring speaker 6R for the R channel. Accordingly, the bi-wiring speaker set of 6L and 6R can be driven in a high-quality sound stereo mode with the bi-wiring connection using the four amplifiers 4A–4D.

In the meantime, since a gain of the amplifier 4A for the L channel and a gain of the amplifier 4B for the C channel are not always equal, it is necessary at the two-channel stereo reproducing time to equalize the gain of the amplifier 4A for the L channel with the gain of the amplifier 4B for the C channel by the gain corrector 7 and make frequency characteristics of the bi-wiring speaker 6L for the L channel flat. Similarly, since a gain of the amplifier 4C for the R channel and a gain of the amplifier 4D for the S channel are not always equal, it is necessary at the two-channel stereo reproducing time to equalize the gain of the amplifier 4C for the R channel with the gain of the amplifier 4D for the S channel by the gain corrector 8 and make frequency characteristics of the bi-wiring speaker 6R for the R channel flat. Normally, the gains of the amplifier 4A and 4C are higher than the gains of the amplifiers 4B and 4D, thereby the gain correctors 7 and 8 have positive gains (that is, the gain correctors increase levels of the input signals), however, when the amplifiers 4B and 4D have higher gains, the gain correctors 7 and 8 need to have negative gains, that is, need to decrease the levels of the input signals.

Figure 12:
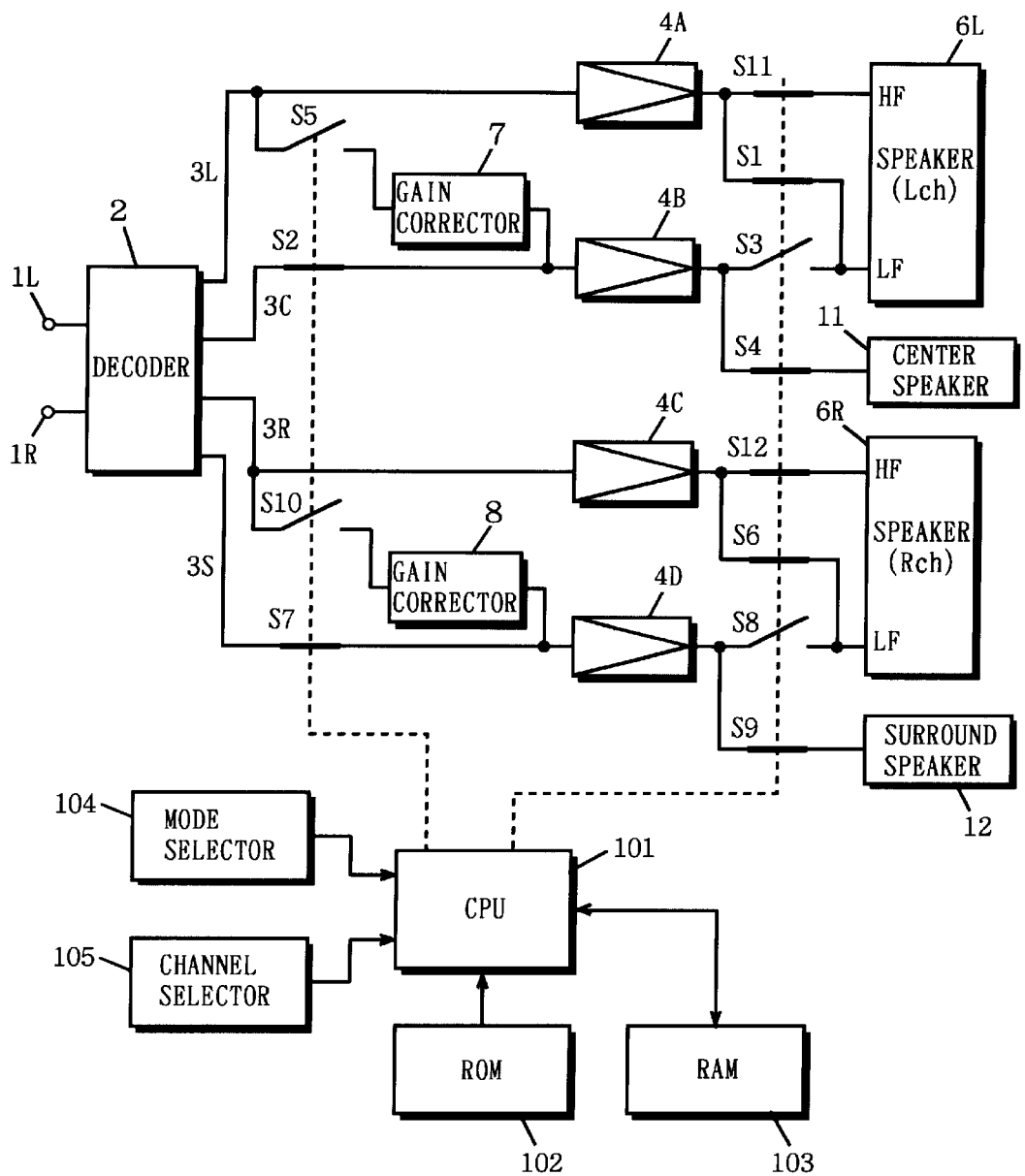
FIG. 12 is a drawing showing a eighth example of the ON/OFF state of each of the switches in the first embodiment of the present invention.

Also, when the channel selector 105 selects the four-channel reproduction, as shown in FIG. 4, the CPU 101 sets the switches S1, S2, S4, S6, S7, S9, S11 and S12 in on states and sets the other switches in off states. In this case, as shown in FIG. 12, the signal 3L for the L channel outputted from the decoder 2 is amplified by the amplifier 4A for the L channel to be given to the terminal HF for high-frequency and the terminal LF for low-frequency of the bi-wiring speaker 6L for the L channel in parallel. Further, the signal 3C for the C channel outputted from the decoder 2 is amplified by the amplifier 4B for the C channel to be given to the center speaker 11. Also, the signal 3R for the R channel outputted from the decoder 2 is amplified by the amplifier 4C for the R channel to be given to the terminal HF for high-frequency and the terminal LF for low-frequency of the bi-wiring speaker 6R for the R channel in parallel. Also, the signal 3S for the S channel outputted from the decoder 2 is amplified by the amplifier 4D for the S channel to be given to the surround speaker 12. Accordingly, at this time, the four-channel reproduction is performed by using the bi-wiring speakers 6L and 6R, the center speaker 11 and the surround speaker 12.

Primarily, it is a principle that amplifiers which have equal gains are connected to the terminals HF for high-frequency and the terminals LF for low-frequency of the bi-wiring speakers 6L and 6R. Therefore, in the above-described first embodiments, the gain correctors 7 and 8 are provided to equalize the substantial gains of the amplifiers 4A–4D. However, there are some cases where deterioration of frequency characteristics caused by dispersion in constants of the gain correctors 7 and 8, difference of speaker models to be used and difference of sound characteristics of listening rooms needs to be corrected in addition. An embodiment capable of dealing with the above correction will be described below.

Figure 13:
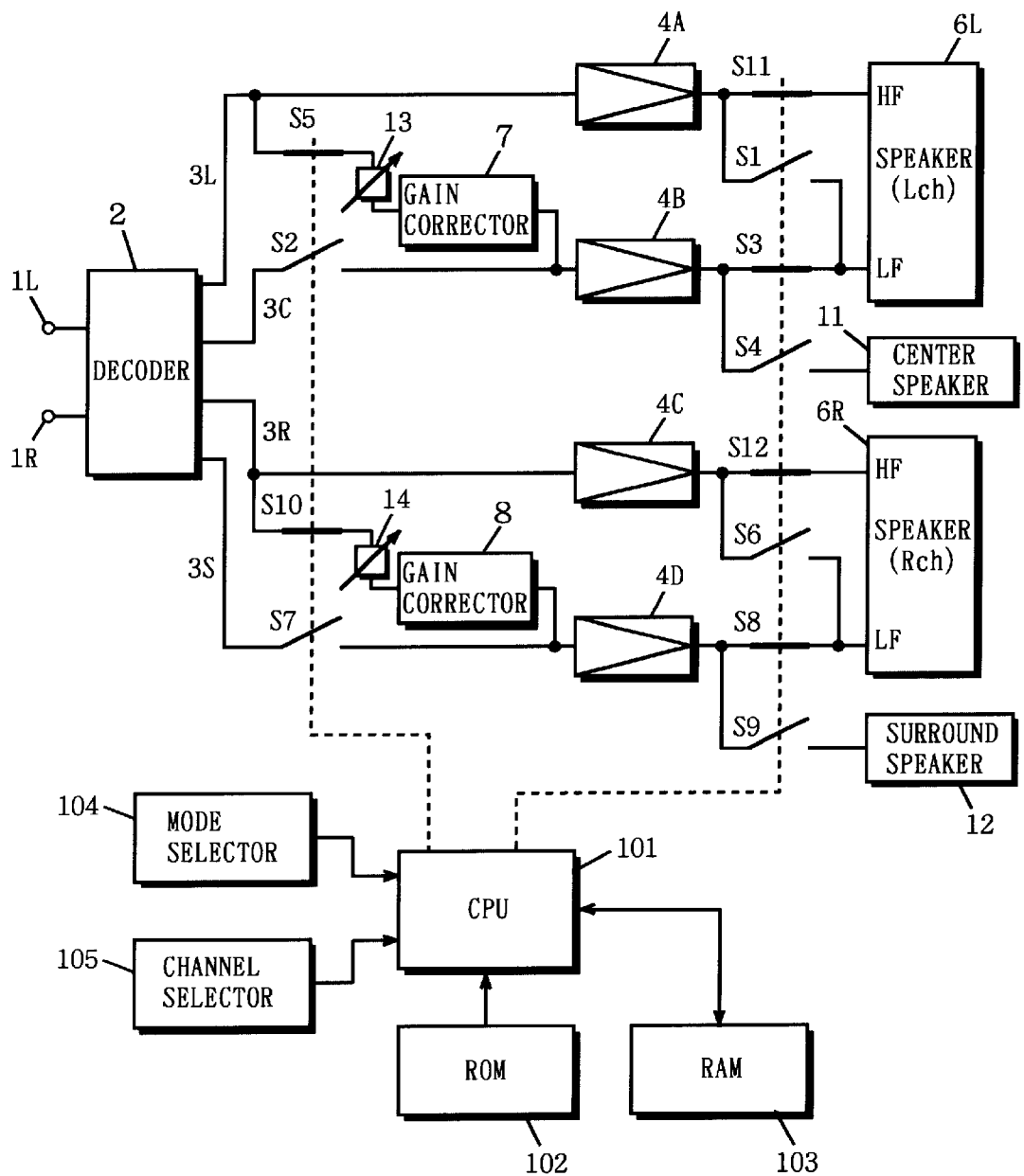
FIG. 13 is a block diagram showing a state of driving bi-wiring speakers by using an AV amplifier according to a second embodiment of the present invention.
Figure 14:
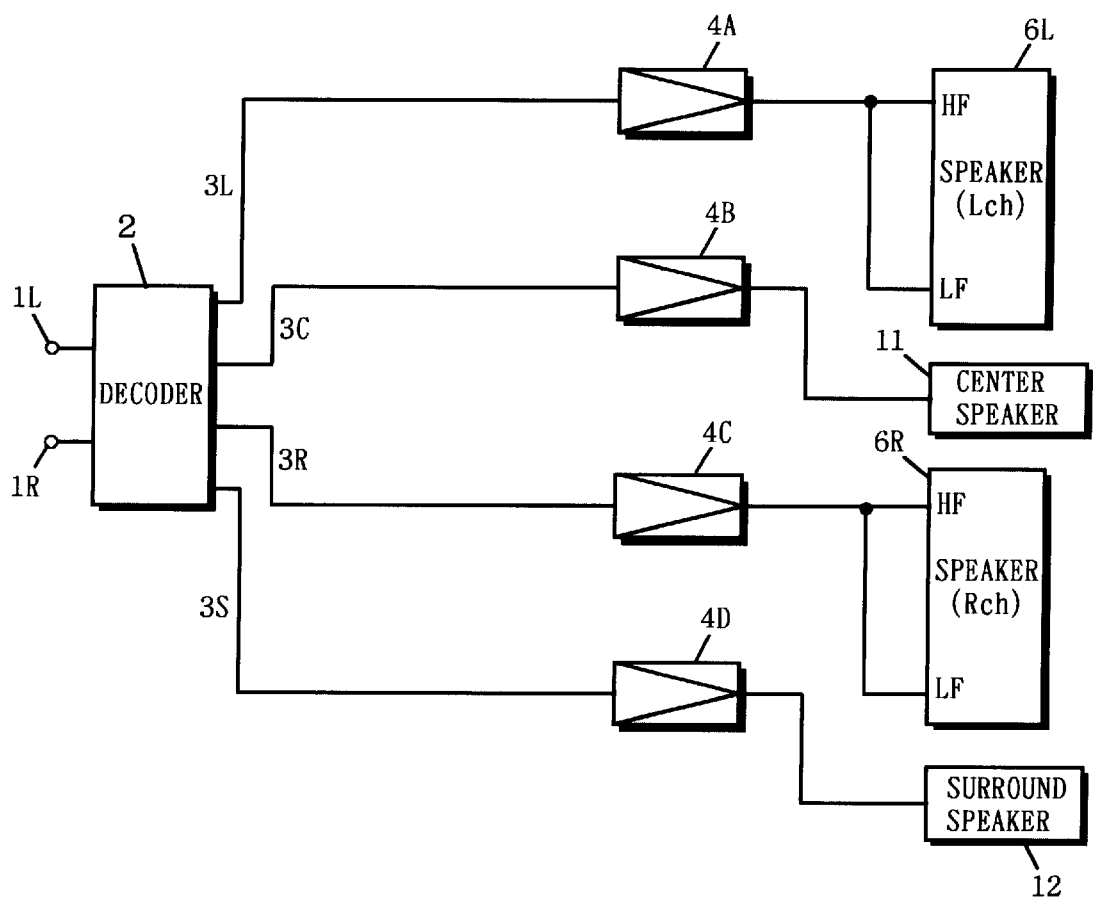
FIG. 14 is a block diagram showing a structure of a conventional AV amplifier.

FIG. 13 is a block diagram showing a structure of an AV amplifier according to a second embodiment of the present invention. In FIG. 13, a difference from the first embodiment shown in FIG. 1 is that first and second variable resistors 13 and 14 are connected in series to input sides of the gain correctors 7 and 8. Since the remaining structure is the same as that of the first embodiment, corresponding parts will be assigned with same reference numerals and the explanation will be omitted.

Gain correcting amounts of the gain correctors 7 and 8 are set higher in advance to make a sum of the gains of the gain corrector 7 and the amplifier 4B for the C channel and a sum of the gains of the gain corrector 8 and the amplifier 4D for the S channel higher than the gains of the amplifier 4A for the L channel and the amplifier 4C for the R channel, respectively, when decreasing amounts of the first and second variable resistors 13 and 14 are set to be minimum.

In the AV amplifier of the second embodiment structured as described in the above, operation in the case of performing the two-channel stereo reproduction will be explained. A switching condition of each of the switches is the same as that in the first embodiment. That is, as shown in FIG. 13, the switches S3, S5 and S11 are turned on and the switches S1, S2 and S4 are turned off on the L channel side. Therefore, the signal 3L for the L channel outputted from the decoder 2 is amplified by the amplifier 4A for the L channel to be given to the terminal HF for high-frequency of the bi-wiring speaker 6L for the L channel. Moreover, the signal 3L for the L channel is adjusted in level by the gain corrector 7 through the first variable resistor 13 and amplified by the amplifier 4B for the C channel to be given to the terminal LF for low-frequency of the bi-wiring speaker 6L for the L channel.

In this case, it is possible to freely adjust the sum of the gains of the gain corrector 7 including the first variable resistor 13 and the amplifier 4B for the C channel in an increasing direction and a decreasing direction relative to the gain of the amplifier 4A for the L channel, by adjusting the first variable resistor 13.

On the other hand, the switching condition on the R channel side is the same as that in the first embodiment (that is, the switches S8, S10 and S12 are turned on and the switches S6, S9 and S12 are turned off), and also the adjustment of the second variable resistor 14 is made as that of the first variable resistor 13.

In the case of the four-channel reproduction, as in the case with the first embodiment, the switches S1, S2, S4, S6, S7, S9, S11 and S12 are in on states and the other switches are in off states. Therefore, the gain correctors 7 and 8 are isolated.

Although the first and second variable resistors 13 and 14 are connected in series to the input sides of the gain correctors 7 and 8 in the above-mentioned second embodiment, the variable resistors may be connected to output sides or provided inside of circuits of the gain correctors 7 and 8. Further, the variable resistors may be replaced by any methods capable of adjusting the gains of the gain correctors 7 and 8.

Although the on/off switches are used in each of the above-described embodiments, it is possible to reduce the number of switches by changing the switches S3 and S4, and S8 and S9 into selector switches and by removing the switches S2, S5, S7 and S10 to provide input selection switches for the amplifiers 4B and 4D. The switches naturally include electrically connected switches as well as mechanically connected switches.

Furthermore, when the bi-wiring speakers 6L and 6R are driven in stereo with the bi-wiring connection, the outputs of the amplifiers 4A and 4C are given to the terminals HF for high-frequency of the bi-wiring speakers 6L and 6R, respectively and the outputs of the amplifiers 4B and 4D are given to the terminals LF for low-frequency of the bi-wiring speakers 6L and 6R, respectively in each of the above-described embodiments, however, in a reverse way, the outputs of the amplifiers 4B and 4D may be given to the terminals HF for high-frequency of the bi-wiring speakers 6L and 6R, respectively and the outputs of the amplifiers 4A and 4C may be given to the terminals LF for low-frequency of the bi-wiring speakers 6L and 6R, respectively.

As stated in the above, according to the above-described embodiments, it is possible to improve the sound quality at the two-channel stereo reproducing time by adding the simple switching circuit and the gain correctors to the AV amplifier to efficiently use the amplifier for the multichannel reproduction at the stereo reproducing time. Moreover, the first and second variable resistors 13 and 14 can make fine adjustment to the gains at the two-channel stereo reproducing time as necessary, thereby it is possible to correct the deterioration of the frequency characteristics caused by the dispersion in constants of the gain correctors, the difference of the speaker models to be used and the difference of the sound characteristics of the listening rooms.

While the invention has been described in detail, the foregoing description is in all aspects illustrative and not restrictive. It is understood that numerous, other modifications and variations can be devised without departing from the scope of the invention.

What is claimed is:

1. An AV amplifier capable of selectively switching between a multichannel reproducing mode and a two-channel stereo reproducing mode, comprising:

a decoder operable to decode input signals in which multichannel signals are encoded to output multichannel signals in the multichannel reproducing mode, and operable to output inputted two-channel stereo signals as they are in the two-channel stereo reproducing mode;

a plurality of amplifiers operable to amplify output signals of said decoder;

a plurality of output terminals to each of which speakers are connected, and which are operable to transfer output signals of said amplifiers to the connected speakers;

a mode selector operable to select either the multichannel reproducing mode or the two-channel stereo reproducing mode; and a switching circuit operable to switch a connected relation among said decoder, said plurality of amplifiers and said plurality of output terminals in accordance with the mode selection by said mode selector, wherein:

said plurality of amplifiers comprises at least first to fourth amplifiers operable to amplify the multichannel signals in the multichannel reproducing mode; and said switching circuit:

when a plurality of speakers for multichannel reproduction are connected to said output terminals and the multichannel reproducing mode is selected, switches the connected relation so that the multichannel signals outputted from said decoder are amplified by said plurality of amplifiers for each channel and the signal outputted from each of the amplifiers is given to the speaker of a corresponding channel; and when a pair of speakers compatible with bi-wiring are connected to said output terminals and the two-channel stereo reproducing mode is selected, switches the connected relation so that among the two-channel stereo signals outputted from said decoder, signals for an L channel are amplified in parallel by said first and second amplifiers in said plurality of amplifiers and signals for an R channel are amplified in parallel by said third and fourth amplifiers in said plurality of amplifiers, and further output signals of said first and second amplifiers are given to one of said pair of speakers in a bi-wiring connection manner and output signals of said third and fourth amplifiers are given to the other one of said pair of speakers in the bi-wiring connection manner.

2. The AV amplifier according to claim 1, further comprising:

a first gain corrector operable to correct a difference between gains of said first and second amplifiers; and a second gain corrector operable to correct a difference between gains of said third and fourth amplifiers;

wherein said switching circuit switches the connected relation so that said first and second gain correctors are activated when said pair of speakers compatible with bi-wiring are connected to said output terminals and the two-channel stereo reproducing mode is selected.

3. The AV amplifier according to claim 2, wherein said first gain corrector is operable to correct gains so that a gain which an output signal of said first amplifier has with respect to the signal for the L channel is nearly equal to a gain which an output signal of said second amplifier has with respect to the signal for the L channel; and said second gain corrector is operable to correct gains so that a gain which an output signal of said third amplifier has with respect to the signal for the R channel is nearly equal to a gain which an output signal of said fourth amplifier has with respect to the signal for the R channel.

4. The AV amplifier according to claim 3, wherein said first and second gain correctors include a fine adjusting device operable to finely adjust the gain correcting amounts.

5. The AV amplifier according to claim 1, wherein:

said switching circuit comprises:

a plurality of switches placed among said decoder, said plurality of amplifiers and said plurality of output terminals as necessary; and a computer unit operable to control on/off states of each of said switches in accordance with the mode selection by said mode selector.

* * * * *